US007009682B2

(12) United States Patent
Bleeker

(10) Patent No.: US 7,009,682 B2
(45) Date of Patent: Mar. 7, 2006

(54) LITHOGRAPHIC APPARATUS AND DEVICE MANUFACTURING METHOD

(75) Inventor: Arno Jan Bleeker, Westerhoven (NL)

(73) Assignee: ASML Netherlands B.V., Veldhoven (NL)

( * ) Notice: Subject to any disclaimer, the term of this patent is extended or adjusted under 35 U.S.C. 154(b) by 32 days.

(21) Appl. No.: 10/715,116

(22) Filed: Nov. 18, 2003

(65) Prior Publication Data

US 2004/0114117 A1 Jun. 17, 2004

(30) Foreign Application Priority Data

Nov. 18, 2002 (EP) ................................ 02257938

(51) Int. Cl.
*G03B 27/32* (2006.01)
*G03B 27/42* (2006.01)

(52) U.S. Cl. .......................................... 355/53; 355/77

(58) Field of Classification Search .................. 355/30, 355/53, 55, 72, 77
See application file for complete search history.

(56) References Cited

U.S. PATENT DOCUMENTS 3,573,975 A 4/1971 Dhaka et al. ............... 117/212
3,648,587 A 3/1972 Stevens ......................... 95/44
4,346,164 A 8/1982 Tabarelli et al. ............ 430/311
4,390,273 A 6/1983 Loebach et al. ............ 355/125
4,396,705 A 8/1983 Akeyama et al. ........... 430/326
4,480,910 A 11/1984 Takanashi et al. ............ 355/30
4,509,852 A 4/1985 Tabarelli et al. .............. 355/30
5,040,020 A 8/1991 Rauschenbach et al. ...... 355/53
5,121,256 A 6/1992 Corle et al. ................. 359/664
5,610,683 A 3/1997 Takahashi .................... 355/53
5,715,039 A 2/1998 Fukuda et al. ................ 355/53
5,825,043 A 10/1998 Suwa ......................... 250/548
5,900,354 A 5/1999 Batchelder .................. 430/395
6,191,429 B1 2/2001 Suwa ......................... 250/548
6,236,634 B1 5/2001 Lee et al. ................... 369/112
6,560,032 B1 5/2003 Hatano ....................... 359/656
6,600,547 B1 7/2003 Watson et al.
6,603,130 B1 8/2003 Bisschops et al. ....... 250/492.1
6,633,365 B1 10/2003 Suenaga ...................... 355/53
2002/0020821 A1 2/2002 Van Santen et al. ........ 250/492
2002/0163629 A1 11/2002 Switkes et al. ............... 355/53
2003/0123040 A1 7/2003 Almogy ....................... 355/69
2003/0174408 A1 9/2003 Rostalski et al. ........... 359/642
2004/0000627 A1 1/2004 Schuster
2004/0021844 A1 2/2004 Suenaga
2004/0075895 A1 4/2004 Lin ............................ 359/380

(Continued)

FOREIGN PATENT DOCUMENTS

DE 206 607 2/1984

(Continued)

OTHER PUBLICATIONS

U.S. Appl. No. 10/850,451, filed May 21, 2004, Streefkerk et al.

(Continued)

*Primary Examiner*—Rodney Fuller
(74) *Attorney, Agent, or Firm*—Pillsbury Winthrop Shaw Pittman LLP

(57) ABSTRACT

In an immersion lithography apparatus, an isolator is provided between the substrate table and the projection system to, for example, prevent currents in the liquid exerting forces on the projection system that might tend to distort the reference frame to which said projection system is connected. The isolator may be maintained still relative to the reference frame by an actuator system responsive to a position sensor mounted on the reference frame. At least a portion of the isolator may have the same refractive index as the liquid.

41 Claims, 2 Drawing Sheets

U.S. PATENT DOCUMENTS

| | | | | |
|---|---|---|---|---|
| 2004/0109237 | A1 | 6/2004 | Epple et al. | |
| 2004/0119954 | A1 | 6/2004 | Kawashima et al. | 355/30 |
| 2004/0125351 | A1 | 7/2004 | Krautschik | 355/53 |

FOREIGN PATENT DOCUMENTS

| | | |
|---|---|---|
| DE | 221 563 | 4/1985 |
| DE | 224 448 A1 | 7/1985 |
| DE | 224448 | 7/1985 |
| DE | 242880 | 2/1987 |
| EP | 0023231 | 2/1981 |
| EP | 0418427 | 3/1991 |
| EP | 0 605 103 A1 | 7/1994 |
| EP | 1039511 | 9/2000 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO 99/49504 | 9/1999 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |

OTHER PUBLICATIONS

U.S. Appl. No. 10/890,389, filed Jul. 14, 2004, Mulkens.

U.S. Appl. No. 10/844,575, filed May 13, 2004, Streefkerk et al.

U.S. Appl. No. 10/367,910, filed Feb. 19, 2003, Suwa et al.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar., 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial Λ/NA scaling equations for resolution, depth of focus, and immersion lithography, *J. Microlith., Microfab., Microsyst.* 1(1):7-12 (2002).

U.S. Appl. No. 10/705,805, filed Nov. 12, 2003, Joeri Lof et al.

U.S. Appl. No. 10/705,783, filed Nov. 12, 2003, Joeri Lof et al.

U.S. Appl. No. 10/743,271, filed Dec. 23, 2003, Helmar Van Santen et al.

U.S. Appl. No. 10/743,266, filed Dec. 23, 2003, Johannes C.H. Mulkens et al.

U.S. Appl. No. 10/705,785, filed Nov. 12, 2003, Antonius T.A.M. Derksen et al.

U.S. Appl. No. 10/724,402, filed Dec. 1, 2003, Klaus Simon et al.

U.S. Appl. No. 10/705,816, filed Nov. 12, 2003, Joeri Lof et al.

U.S. Appl. No. 10/719,683, filed Nov. 24, 2003, Bob Streefkerk et al.

U.S. Appl. No. 10/705,804, filed Nov. 12, 2003, Joannes T. Desmit et al.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

EP Search Report for EP 02257938 dated Sep. 25, 2003.

M. Switkes et al., "Immersion Lithography at 157 nm", MIT Lincoln Lab, Orlando 2001-1, Dec. 17, 2001.

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

LITHOGRAPHIC APPARATUS AND DEVICE MANUFACTURING METHOD

This application claims priority from European patent application EP 02257938.7, filed Nov. 18, 2002, herein incorporated in its entirety by reference.

FIELD

The present invention relates to immersion lithography.

BACKGROUND

The term "patterning device" as here employed should be broadly interpreted as referring to any device that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such a patterning device include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning device can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at one time; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT patent application WO 98/40791, incorporated herein by reference.

It has been proposed to immerse the substrate in a lithographic projection apparatus in a liquid having a relatively high refractive index, e.g. water, so as to fill a space between the final element of the projection lens and the substrate. The point of this is to enable imaging of smaller features since the exposure radiation will have a shorter wavelength in the liquid. (The effect of the liquid may also be regarded as increasing the effective NA of the system.)

SUMMARY

When a substrate table is moved, e.g., in a scanning exposure, in the liquid, the viscosity of the liquid means that a force will be exerted on the projection system and hence to a reference frame to which some or all position sensors in the apparatus may be attached. To allow accurate positioning of the substrate and mask stages, the reference frame must provide an extremely rigid and stable reference for the different sensors mounted on it. The force exerted on it via the liquid will distort the reference frame sufficiently to invalidate the different position measurements based upon it.

Accordingly, it maybe advantageous to provide, for example, a lithographic projection apparatus in which a space between the substrate and projection system is filled with a liquid yet the reference frame is effectively isolated from disturbances caused by movement of the substrate stage.

According to an aspect, there is provided a lithographic projection apparatus comprising:

- a support configured to hold a patterning device, the patterning device configured to pattern a beam of radiation according to a desired pattern;
- a substrate table configured to hold a substrate;
- a projection system configured to project the patterned beam onto a target portion of the substrate;
- a liquid supply system configured to at least partly fill a space between said projection system and said substrate, with a liquid through which said beam is to be projected; and
- an isolator, having at least a portion to allow passage of said beam therethrough, provided between said projection system and said substrate table and mechanically isolated from said projection system.

The isolator between the projection system and the substrate table isolates the projection system from the substrate table and prevents the transmission of forces through the liquid to the projection system and hence to the reference frame. Movements of the substrate table therefore do not disturb the reference frame and the sensors mounted on it. In an embodiment, the isolator comprises a transparent plate.

In an embodiment, a portion of the isolator has a refractive index at the wavelength of the beam substantially the same as the refractive index of the liquid at that wavelength. In this way, the isolator does not introduce any unwanted optical effects.

In an embodiment, the isolator is so shaped and positioned that liquid is divided into two parts, one part between the projection system and the isolator and the other part between the isolator and the substrate table, and with no liquid communication between the two parts. With this arrangement, complete isolation between the substrate table and projection system may be assured.

In an embodiment, there is provided a device configured to maintain said isolator substantially stationary relative to said projection system. The device configured to maintain the isolator stationary may comprise an actuator system which may comprise a position sensor configured to measure the position of the isolator relative to the projection system and an actuator, coupled to said position sensor, configured to maintain said isolator at a predetermined position relative to said projection system. In an embodiment, the position sensor is mounted on the reference frame and the actuator is mounted on a base frame from which the reference frame is mechanically isolated. The actuator may also be responsive to positioning instructions provided to the positioning system for the substrate table to provide a feed-forward control in addition to or instead of feedback control via the position sensor.

According to an aspect, there is provided a device manufacturing method comprising:

- providing a liquid to at least partly fill a space between a substrate and a projection system; and
- projecting a patterned beam of radiation, through an isolator mechanically isolated from said projection system between said substrate and said projection system and through said liquid, onto a target portion of the substrate.

In an embodiment, said method comprises maintaining said isolator substantially stationary relative to said projection system.

Although specific reference may be made in this text to the use of the apparatus described herein in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm).

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
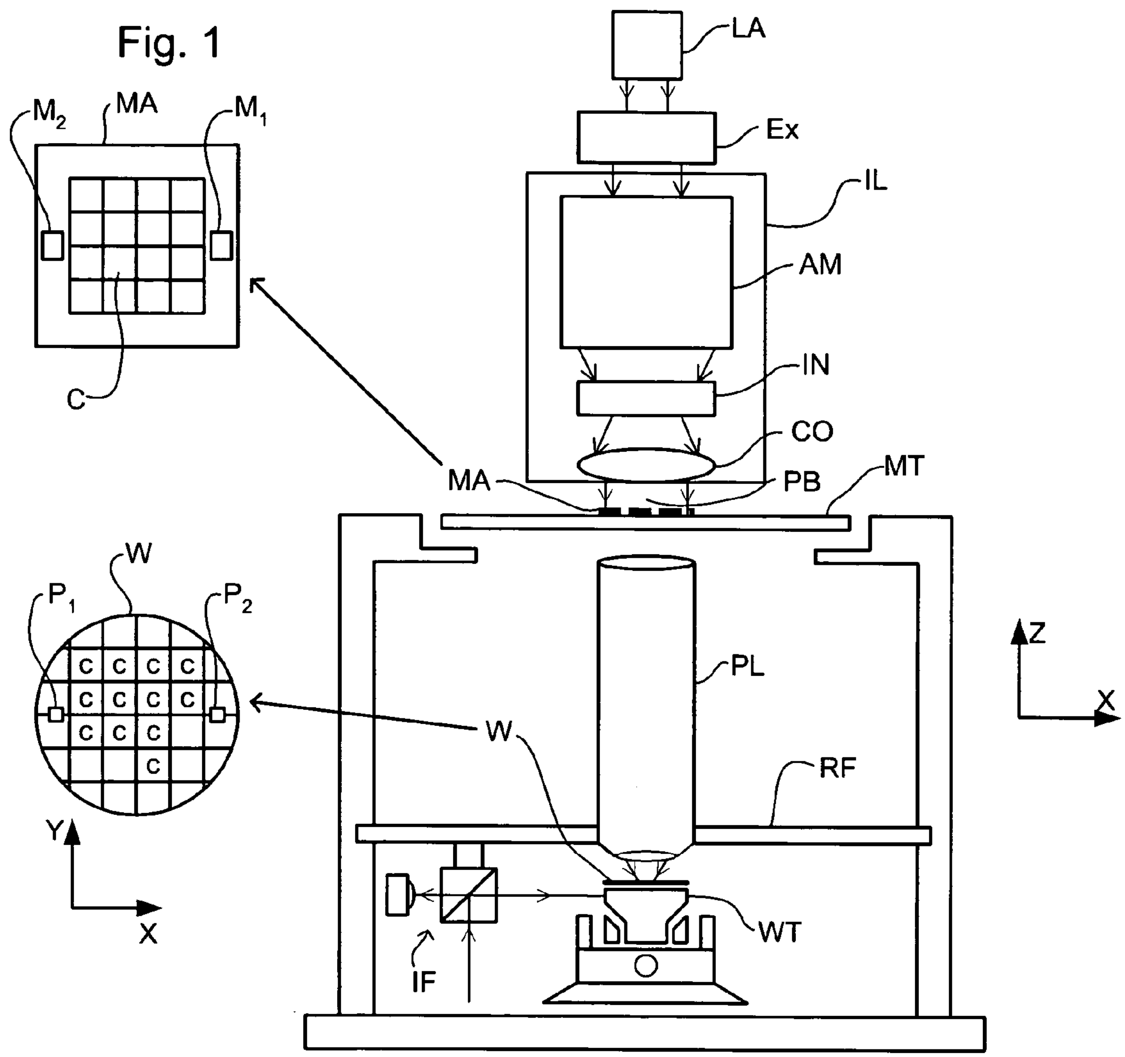
FIG. 1 depicts a lithographic projection apparatus according to an embodiment of the invention.

FIG. 1 schematically depicts a lithographic projection apparatus according to a particular embodiment of the invention. The apparatus comprises:

- a radiation system Ex, IL, for supplying a projection beam PB of radiation (e.g. DUV radiation), which in this particular case also comprises a radiation source LA;
- a first object table (mask table) MT provided with a mask holder for holding a mask MA (e.g. a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g. a refractive lens system) for imaging an irradiated portion of the mask MA onto a target portion C (e.g. comprising one or more dies) of the substrate W.

As here depicted, the apparatus is of a transmissive type (e.g. has a transmissive mask). However, in general, it may also be of a reflective type, for example (e.g. with a reflective mask). Alternatively, the apparatus may employ another kind of patterning device, such as a programmable mirror array of a type as referred to above.

The source LA (e.g. an excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

- In step mode, the mask table MT is kept essentially stationary, and an entire mask image is projected at one time (i.e. a single "flash") onto a target portion C. The substrate table WT is then shifted in the x and/or y directions so that a different target portion C can be irradiated by the beam PB;
- In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
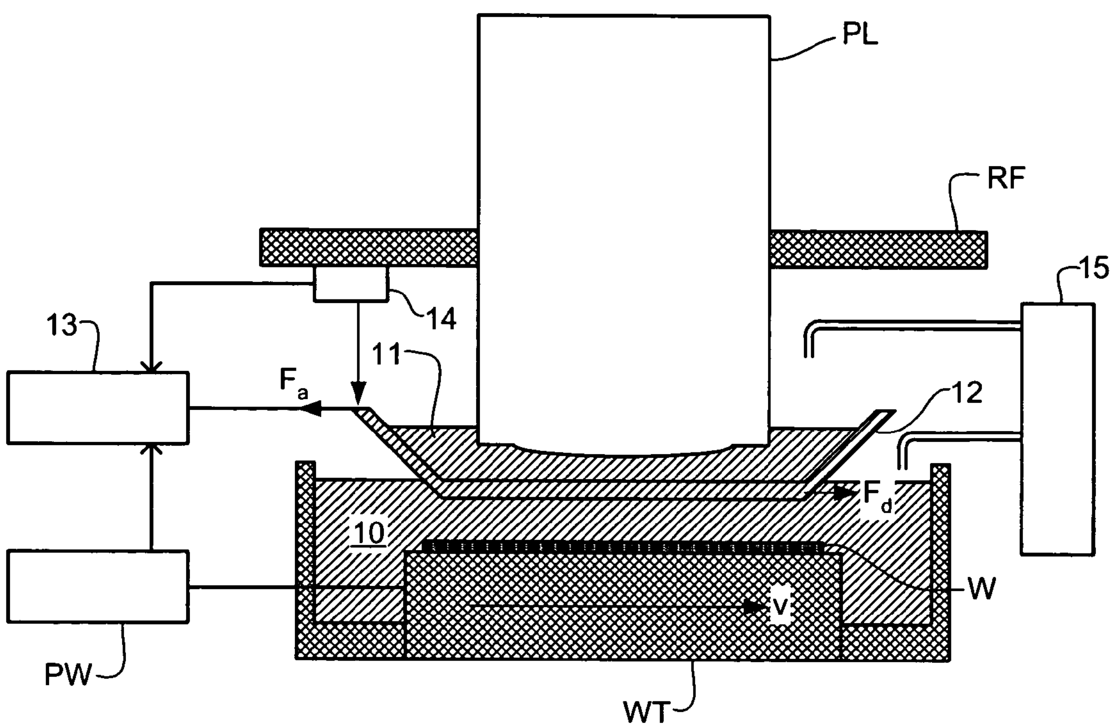
FIG. 2 depicts the substrate table immersion and projection lens isolation arrangements according to an embodiment of the invention.

FIG. 2 shows a substrate stage according to an embodiment in greater detail. The substrate table WT is immersed in a liquid 10 having a relatively high refractive index, e.g. water, provided by liquid supply system 15. The liquid has the effect that the radiation of the projection beam has a shorter wavelength in the liquid than in air or a vacuum, allowing smaller features to be resolved. It is well known that the resolution limit of a projection system is determined, inter alia, by the wavelength of the projection beam and the numerical aperture of the system. The presence of the liquid may also be regarded as increasing the effective numerical aperture.

A transparent plate, or dish, 12 is positioned between the projection system PL and the substrate table WT and also filled with liquid 11, in an embodiment the same liquid as liquid 10. Thus, an entire space between the projection system PL and the substrate W is filled with liquid but the liquid 11 between the plate 12 and the projection system PL is separate from the liquid 10 between the plate 12 and the substrate W. In an embodiment, no liquid need be provided between the plate 12 and the projection system PL.

In an embodiment, the transparent plate 12 has the same refractive index as the liquid 10, 11 at least at the wavelength of the projection beam and any sensor beams, e.g. of through-the lens alignment systems, that may pass through the plate. This avoids optical side-effects, which otherwise would need to be characterized and compensated for. Of course the whole plate need not be transparent, only those parts through which a beam must pass.

The substrate table WT is moved, e.g., in the direction indicated by arrow v, by second positioning means PW, e.g., to perform a scanning exposure. The movement of the substrate table causes currents in the liquid 10 which in turn will exert forces on the plate 12. To prevent the forces being further propagated to the projection system PL and reference frame RF, the transparent plate 12 is maintained stationary relative to the projection lens PL by an actuator system. Since the plate 12 is stationary there is no disturbance of the liquid 11 and hence no force transference to the projection system PL.

The actuator system for maintaining the plate 12 stationary comprises actuators 13 which are controlled in a feedback loop in response to the position of the plate 12 as measured by position sensor 14 mounted on the reference frame RF and/or in a feed-forward loop based on positioning instructions sent to the second positioning means PW. The control system for the actuator system can implement anti noise measures. Interferometers, capacitive sensors, and encoders may be used as the position sensors and Lorentz motors or voice coil motors as the actuators.

The use of actuators rather than a stiff connection to the bath in which the substrate table WT is immersed can facilitate easy removal of the substrates from the substrate table WT after imaging without unduly increasing the volume of liquid in the bath.

It will be appreciated that the force $F_d$ exerted on the plate 12 is not necessarily parallel to or linearly related to the motion v of the substrate table WT, because of turbulence and delays in the transmission of force through the liquid 10. This may limit the usefulness of feed-forward control. Nevertheless, it is important that the force $F_a$ exerted on the plate 12 counters the force $F_d$ transmitted through the liquid 10 sufficiently that disturbances in the liquid 11 are kept low enough that the forces transferred to the projection lens are within acceptable limits.

It should be noted that in some circumstances, e.g., if the substrate table movements are relatively slow and the viscosity of the liquid low, it may not be necessary to use an actuator system to maintain the plate 12 stationary, instead it may be fixed, e.g., to the base frame or another stationary part of the apparatus isolated from the reference frame.

As used herein, an isolator is any structure, including without limitation the plate or dish described above, that limits or prevents transmittance of vibrations or forces through liquid, between the projection system and the substrate table, to the projection system. The vibrations or forces referred to above may include vibrations or forces caused by the movement of liquid between the projection system and the substrate table, whether such movement is due to a flow caused by a liquid supply system or by movement of the substrate table. The vibrations or forces referred to above may also or alternatively include vibrations or forces induced into liquid, between the projection system and the substrate table, from the substrate table or other structure in contact with the liquid.

While specific embodiments of the invention have been described above, it will be appreciated that the invention may be practiced otherwise than as described. The description is not intended to limit the invention.

What is claimed is:

1. A lithographic projection apparatus comprising:

a support configured to hold a patterning device, the patterning device configured to pattern a beam of radiation according to a desired pattern;

a substrate table configured to hold a substrate;

a projection system configured to project the patterned beam onto a target portion of the substrate;

a liquid supply system configured to at least partly fill a space between said projection system and said substrate, with a liquid through which said beam is to be projected; and an isolator, having at least a portion to allow passage of said beam therethrough, provided between said projection system and said substrate table and mechanically isolated from said projection system to limit or prevent transmittance of vibrations or forces through the liquid to the projection system.

2. Apparatus according to claim 1, wherein said isolator comprises a transparent plate.

3. Apparatus according to claim 1, wherein said portion is transparent and has a refractive index at the wavelength of said beam substantially the same as the refractive index of the liquid at that wavelength.

4. Apparatus according to claim 1, wherein said isolator is so shaped and positioned that a first liquid part is maintained between the projection system and the isolator and a second liquid part is maintained between the isolator and the substrate table, and with no liquid communication between the first and second liquid parts.

5. Apparatus according to claim 1, comprising an actuator system configured to maintain said isolator substantially stationary relative to said projection system.

6. Apparatus according to claim 5, wherein said actuator system comprises a position sensor configured to measure the position of the isolator relative to the projection system and an actuator coupled to said position sensor.

7. Apparatus according to claim 6, wherein said position sensor is mounted on a reference frame which also supports said projection system.

8. Apparatus according to claim 7, wherein said actuator is mounted on a base frame from which the reference frame is mechanically isolated.

9. Apparatus according to claim 5, wherein said actuator system is controlled in a feedback manner.

10. Apparatus according to claim 5, wherein said actuator system is controlled in a feed-forward manner.

11. Apparatus according to claim 1, wherein said support and said substrate table are movable in a scanning direction to expose said substrate.

12. Apparatus according to claim 1, wherein said isolator is connected to a base frame of the apparatus.

13. Apparatus according to claim 12, wherein said projection system is connected to a reference frame which is isolated from the base frame.

14. Apparatus according to claim 13, wherein said reference frame comprises one or more position sensors to measure a position of the substrate, the substrate table, or both.

15. Apparatus according to claim 1, wherein said liquid supply system is configured to provide a first liquid portion through which the patterned beam can be projected, said substrate capable of imparting a vibration in said first liquid portion and to provide a second liquid portion through which the patterned beam can be projected, said second liquid portion being in contact with said projection system and said isolator is disposed between said first and second liquid portions to inhibit a vibration in said first liquid portion from being transmitted to said second liquid portion.

16. A device manufacturing method comprising:

providing a liquid to at least partly fill a space between a substrate and a projection system; and projecting a patterned beam of radiation, through an isolator, mechanically isolated from said projection system to limit or prevent transmittance of vibrations or forces through the liquid to the projection system, between said substrate and said projection system and through said liquid, onto a target portion of the substrate.

17. Method according to claim 16, wherein said isolator comprises a transparent plate.

18. Method according to claim 16, wherein said isolator comprises at least a portion having a refractive index at the wavelength of said beam substantially the same as the refractive index of the liquid at that wavelength.

19. Method according to claim 16, wherein said isolator is so shaped and positioned that a first liquid part is maintained between the projection system and the isolator and a second liquid part is maintained between the isolator and the substrate table, and with no liquid communication between the first and second liquid parts.

20. Method according to claim 16, comprising maintaining said isolator substantially stationary relative to said projection system.

21. Method according to claim 20, wherein said maintaining comprises measuring the position of said isolator relative to the projection system and actuating said isolator using said measured position.

22. Method according to claim 21, wherein said measuring is performed using a position sensor mounted on a reference frame which also supports said projection system.

23. Method according to claim 21, wherein said actuating is performed using an actuator mounted on a base frame from which the reference frame is mechanically isolated.

24. Method according to claim 21, comprising controlling said actuating in a feedback manner.

25. Method according to claim 21, comprising controlling said actuating in a feed-forward manner.

26. Method according to claim 16, comprising moving a patterning device used to pattern the beam of radiation and said substrate in a scanning direction to expose said substrate.

27. Method according to claim 16, wherein said isolator is connected to a base frame of a lithographic apparatus.

28. Method according to claim 27, wherein said projection system is connected to a reference frame which is isolated from the base frame.

29. Method according to claim 28, wherein said reference frame comprises one or more position sensors to measure a position of the substrate, the substrate table, or both.

30. Method according to claim 16, comprising providing a first liquid portion through which the patterned beam can be projected, said substrate capable of imparting a vibration in said first liquid portion and providing a second liquid portion through which the patterned beam can be projected, said second liquid portion being in contact with said projection system, wherein said isolator is disposed between said first and second liquid portions to inhibit a vibration in said first liquid portion from being transmitted to said second liquid portion.

31. A lithographic projection apparatus comprising:

a support configured to hold a patterning device, the patterning device configured to pattern a beam of radiation according to a desired pattern;

a movable substrate table configured to hold a substrate;

a projection system configured to project the patterned beam onto a target portion of the substrate;

a liquid supply system configured to provide a first liquid portion through which the patterned beam can be projected, said substrate table capable of imparting a vibration in said first liquid portion and to provide a second liquid portion through which the patterned beam can be projected, said second liquid portion being in contact with said projection system; and a vibration isolator disposed between said first and second liquid portions to inhibit a vibration in said first liquid portion from being transmitted to said second liquid portion.

32. Apparatus according to claim 31, wherein said isolator comprises a transparent plate.

33. Apparatus according to claim 31, wherein said isolator comprises a portion that is transparent and has a refractive index at the wavelength of said beam substantially the same as the refractive index of the liquid at that wavelength.

34. Apparatus according to claim 31, comprising an actuator system configured to maintain said isolator substantially stationary relative to said projection system.

35. Apparatus according to claim 34, wherein said actuator system comprises a position sensor configured to measure the position of the isolator relative to the projection system and an actuator coupled to said position sensor.

36. Apparatus according to claim 35, wherein said position sensor is mounted on a reference frame which also supports said projection system.

37. Apparatus according to claim 36, wherein said actuator is mounted on a base frame from which the reference frame is mechanically isolated.

38. Apparatus according to claim 31, wherein said support and said substrate table are movable in a scanning direction to expose said substrate.

39. Apparatus according to claim 31, wherein said isolator is connected to a base frame of the apparatus.

40. Apparatus according to claim 39, wherein said projection system is connected to a reference frame which is isolated from the base frame.

41. Apparatus according to claim 40, wherein said reference frame comprises one or more position sensors to measure a position of the substrate, the substrate table, or both.

* * * * *